United States Patent
Erdogan et al.

(10) Patent No.: US 9,520,989 B2
(45) Date of Patent: Dec. 13, 2016

(54) PHASE DETECTOR AND RETIMER FOR CLOCK AND DATA RECOVERY CIRCUITS

(71) Applicant: TEXAS INSTRUMENTS INCORPORATED, Dallas, TX (US)

(72) Inventors: Mustafa Ulvi Erdogan, Allen, TX (US); Sridhar Ramaswamy, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/810,087

(22) Filed: Jul. 27, 2015

(65) Prior Publication Data

US 2016/0028537 A1    Jan. 28, 2016

Related U.S. Application Data

(60) Provisional application No. 62/029,783, filed on Jul. 28, 2014.

(51) Int. Cl.
*H03L 7/00* (2006.01)
*H04L 7/033* (2006.01)
*H04L 25/00* (2006.01)
*H03L 7/081* (2006.01)

(52) U.S. Cl.
CPC ............ *H04L 7/033* (2013.01); *H03L 7/0816* (2013.01); *H04L 25/00* (2013.01); *H04L 7/0337* (2013.01)

(58) Field of Classification Search
CPC ..... H04L 7/0331; H04L 7/0443; H04L 7/0337
See application file for complete search history.

(56) References Cited

U.S. PATENT DOCUMENTS

| | | | | |
|---|---|---|---|---|
| 4,696,016 A | * | 9/1987 | Rozema | H04L 7/0331 327/165 |
| 5,539,784 A | * | 7/1996 | Brauns | H04L 7/0338 327/144 |
| 7,308,060 B1 | * | 12/2007 | Wall | H03L 7/081 375/355 |
| 8,417,115 B2 | * | 4/2013 | Nguyen | H04B 10/07953 375/317 |
| 2001/0007436 A1 | * | 7/2001 | Dosho | H03D 13/004 331/11 |
| 2013/0329513 A1 | * | 12/2013 | Kim | H03L 7/0812 365/233.12 |

* cited by examiner

*Primary Examiner* — Dac Ha
(74) *Attorney, Agent, or Firm* — Gregory J. Albin; Charles A. Brill; Frank D. Cimino

(57) ABSTRACT

A phase detector and retimer circuit that includes a retimer circuit, a phase shift circuit coupled to the retimer circuit, and an error signal generation circuit coupled to the retimer circuit and the phase shift circuit. The retimer circuit is configured to receive a data signal and generate a first retimed data signal based on a first phase of a clock signal and a second retimed data signal based on a second phase of the clock signal. The phase shift circuit is configured to receive the data signal and phase shift the data signal to generate first, second, third, and fourth phase shifted data signals. The error signal generation circuit is configured to generate a first error signal and a second error signal based on the first and second retimed data signals and the first, second, third, and fourth phase shifted data signals.

20 Claims, 4 Drawing Sheets

PHASE DETECTOR AND RETIMER FOR CLOCK AND DATA RECOVERY CIRCUITS

CROSS-REFERENCE TO RELATED APPLICATIONS

The present application claims priority to U.S. Provisional Patent Application No. 62/029,783, filed Jul. 28, 2014, titled "Half-Rate Phase Detector Circuit For Clock And Data Recovery Circuits," which is hereby incorporated herein by reference in its entirety.

BACKGROUND

In many communication systems, data is streamed from one device to another without an accompanying clock signal. During the transmission, the signals carrying the data streams may become jittery and difficult to decipher and process by the receiving device. Therefore, many systems utilize clock and data recovery circuits (CDR) to retime the incoming signals carrying the data streams and transmit the retimed signals to the receiving device. This requires the CDR to generate a clock that locks to the frequency of the streamed data. In many systems, the CDR detects the frequency of the incoming signals and phase aligns the clock signal to the incoming signals. The incoming signal is then retimed with a clean clock that has been generated by the CDR. The retimed signal then may be output to the receiving device for further processing.

SUMMARY

The problems noted above are solved in large part by systems and methods for generating error signals in a clock and data recovery circuit. In some embodiments, a phase detector and retimer circuit includes a retimer circuit, a phase shift circuit coupled to the retimer circuit, and an error signal generation circuit coupled to the retimer circuit and the phase shift circuit. The retimer circuit is configured to receive a data signal and generate a first retimed data signal based on a first phase of a clock signal and a second retimed data signal based on a second phase of the clock signal. The phase shift circuit is configured to receive the data signal and phase shift the data signal to generate a first phase shifted data signal, a second phase shifted data signal, a third phase shifted data signal, and a fourth phase shifted data signal. The error signal generation circuit is configured to generate a first error signal and a second error signal based on the first and second retimed data signals and the first, second, third, and fourth phase shifted data signals.

Another illustrative embodiment is a clock and data recovery circuit comprising a phase-frequency detector (PFD) circuit and a voltage-controlled oscillator (VCO) coupled to the PFD. The PFD circuit is configured to lock a clock signal to a data signal and includes a frequency detector and a phase detector and retimer circuit. The phase detector and retimer circuit is configured to generate an UP error signal and a DOWN error signal based on a first and a second retimed data signal and a first, a second, a third, and a fourth phase shifted data signal. The VCO is configured to generate a VCO output signal that, after being divided, becomes the clock signal.

Yet another illustrative embodiment is a method for generating error signals in a clock and data recovery circuit. The method may comprise generating a first and a second retimed data signal. The method also comprises generating a first, a second, a third, and a fourth phase shifted data signal. The method also comprises generating a first UP signal by performing an exclusive OR (XOR) function on the first retimed data signal and the first phase sifted data signal. The method also comprises generating a second UP signal by performing a XOR function on the second retimed data signal and the second phase shifted data signal. The method also comprises generating an UP error signal based on the first UP signal, the second UP signal, and a first phase of a clock signal.

BRIEF DESCRIPTION OF THE DRAWINGS

For a detailed description of various examples, reference will now be made to the accompanying drawings in which.

NOTATION AND NOMENCLATURE

Figure 1:
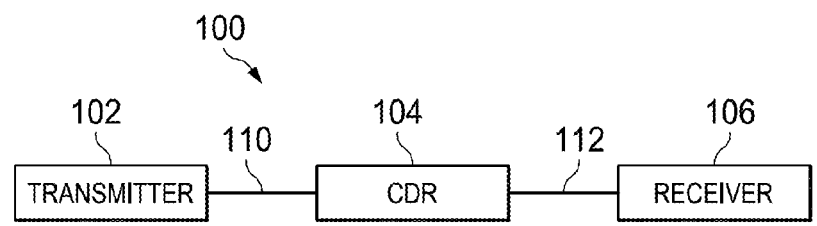
FIG. 1 shows a block diagram of a communication system in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Communication systems may be utilized to transfer data from a transmitting device to a receiving device for further processing. One type of communication system is a fiber optic system. A fiber optic system transmits data through the transmission of pulses of light through an optical fiber. Due to the optics in the optical fiber and noise from semiconductor devices, the data signals may incur jitter (i.e., instantaneous deviation from the original periodicity of the data signal sent by the transmitter which may be observed in the signal amplitude, phase, or frequency of the signal). This jitter may decrease, or in some cases prevent entirely, the receiving device's capability to process the data signal. Clock and data recovery circuits (CDRs) may be utilized in these communication systems to retime the data signal, so that the receiving device may receive a correctly timed, jitter-free signal. Because the data signal is transmitted without an accompanying clock, the CDR detects the frequency and/or phase of the data signal in order to create a clock that is locked to the frequency and phase of the data signal. This allows for a retimed signal to be provided to the receiving device.

Conventional CDRs utilize phase detector and retimer (PDR) circuits to retime the incoming data signals and align the phase of the clock signal to the phase of the data signal. Some CDRs employ half-rate architecture, wherein both edges of clock are used to retime input data. Many of these conventional CDRs only sample input data with in-phase and quadrature clocks (thus they do not sample all transitions in the data signal) in order to generate error signals utilized in locking and maintaining lock of the frequency and/or phase of the clock signal to the incoming data signal. However, these PDRs provide suboptimal sampling position with data pulse width shrinkage (e.g., the pulse width of a HIGH signal is smaller than the pulse width of a LOW signal). This is because these PDRs assume that the falling edge (without sampling the falling edge) is 1 bit away even though it is not (due to the changes in size of the pulse width). Thus, the clock may be positioned at an offset. Therefore, it is desirable to sample both the rising edge and the falling edge of the incoming data signal. Furthermore, conventional linear phase detectors respond proportionally to the phase difference of the two input signals (the clock signal and the incoming data signal). Unfortunately, this leads to a low gain, high jitter signal. However, it is desirable to have a high phase gain because the higher the phase detector gain, the lower the input referred noise. This leads to a lower jitter signal. Thus, in addition to having a PDR that samples all transitions of the incoming data stream, it is desirable that the PDR provide a high phase gain.

FIG. 1 shows a block diagram of a communication system 100 in accordance with various embodiments. Communication system 100 may include transmitter 102, clock and data recovery circuit (CDR) 104, and receiver 106. Communication system 100 may be any type of communication system, including a fiber optic communication system. Transmitter 102 is any device that may transmit signals, including signals carrying data. The signals transmitted by transmitter 102 may be generated by transmitter 102 or they may be received by transmitter 102 from another device and retransmitted to the receiver 106. In an embodiment, the signals transmitted by transmitter 102 are fiber optic signals and may include telephone signals, internet communication, and/or cable television signals. In alternative embodiments, the signals transmitted by transmitter 102 may include any other type of electrical or optical signal. In some embodiments, transmitter 102 may include a light-emitting diode (LED) or a laser diode.

CDR 104 is coupled to transmitter 102 through a communication link and is configured to receive the signal transmitted by transmitter 102, shown as data signal 110. The communication link may be a fiber optic or electrically conductive cable or any other type of communication link that allows communication of an electrical or optical signal from transmitter 102 to CDR 104. While data signal 110 may be any waveform, in some embodiments, it is a square wave and may be an optical signal. Additionally, data signal 110 may be a differential pair of signals. In other words, data signal 110 may include a pair of the same signal, except that the two signals are 180 degrees out of phase with each other. CDR 104 may be an electrical circuit configured to generate a clock signal from data signal 110. In some embodiments, data signal 110 does not contain an accompanying clock signal. Therefore, CDR 104 generates a clock signal from an approximate frequency reference and phase aligns to the transitions in data signal 110.

CDR 104 may generate an output signal 112 that has a phase and frequency related to the phase and frequency of the data signal 110. Thus, the data within data signal 110 may be transmitted within the output signal 112 of CDR 104. In other words, CDR 104 is configured to sample data signal 110 and regenerate it with the CDR 104 generated clean clock signal. Thus, CDR 104 retimes data signal 110 by replicating data signal 110 under a clean clock domain and outputs a signal 112 with a related phase and frequency that regenerates the same data. This may eliminate jitter that data signal 110 may have developed while being carried in the communication link.

Receiver 106 is coupled to CDR 104 through a communication link that carries output signal 112. Receiver 106 is configured to receive output signal 112 from CDR 104. The communication link may be a fiber optic or electrically conductive cable or any other type of communication link that allows communication of output signal 112 to receiver 106. While output signal 112 may be any waveform, in some embodiments, it is a square wave and may be an optical signal. Because output signal 112 may be an optical signal, in an embodiment, receiver 106 is configured to receive fiber optic signals and may include a photodetector. Receiver 106 then may process the data contained in the output signal 112 for further use. In some embodiments, the CDR 104 is separate from, but coupled to, the receiver 106. In other embodiments, the CDR 104 is a circuit that is included as part of the receiver 106.

Figure 2:
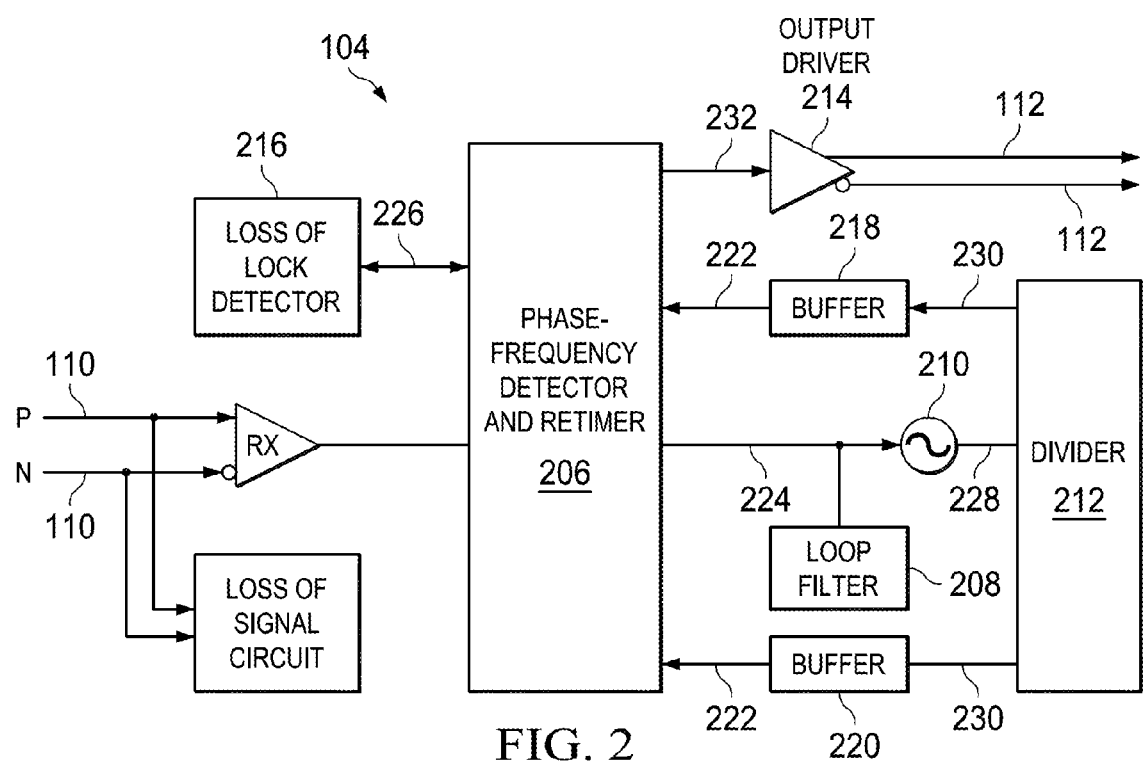
FIG. 2 shows a block diagram of a clock and data recovery circuit (CDR) in accordance with various embodiments.

FIG. 2 shows a circuit diagram of CDR 104 in accordance with various embodiments. CDR 104 may include a receiver 202, a loss of signal circuit (LOS) 204, a phase-frequency detector (PFD) 206, a loop filter 208, a voltage-controlled oscillator (VCO) 210, a divider 212, buffers 218 and 220, an output driver 214, and a loss of lock (LOL) detector 216. Receiver 202 is configured to receive data signal 110. While receiver 202 is depicted as a p-n photodiode in FIG. 2 receiving data signal 110 as a differential signal, receiver 202 may be any type of receiver and in some embodiments, any photodetector including a p-i-n photodiode, an avalanche photodiode, or a metal-semiconductor-metal photodetector that is capable of receiving optical signals. LOS 204 is a circuit that is configured to determine whether data signal 110 is present for signal processing by CDR 104.

PFD 206 is configured to determine the frequency of the data signal 110 (i.e., the frequency of the data stream received by receiver 202). PFD 206 may also be configured to determine the phase in which to align the clock signal 222 of CDR 104. In other words, because the data signal 110 may be in the form of a square wave, the PFD 206 is configured to determine where to align the edges of the clock signal 222, which also may be in the form of a square wave, with respect to the edges of data signal 110. Additionally, PFD 206 may retime data signal 110 (i.e., PFD 206 may sample data signal 110 and regenerate it utilizing clock signal 222).

PFD 206 determines the difference in frequency and/or phase between data signal 110 and clock signal 222. If the signals are square waves, PFD 206 may determine this difference by comparing the rising edge of the data signal 110 square wave to the rising edge of the clock signal 222 square wave. PFD 206 then may produce error signals based on the amount of frequency and/or phase difference it has detected between data signal 110 and clock signal 222. The PFD 206 then may translate the error signals into proportional positive and negative charge packets in the form of combined charge pump output signal 224 which is then fed into loop filter 208. This may cause the voltage at the output of loop filter 208 to increase or decrease based on the amount of positive or negative charge that enters loop filter 208.

Loop filter 208 may be a low pass filter which may be used to convert combined charge pump output signal 224, which is in the form of a current, to voltage and also to create loop stability. Loop filter 208 may also be used to limit reference frequency energy (i.e., ripple) which may appear at the PFD 206 combined charge pump output signal 224. The filtered combined charge pump output signal 224 then may be provided to VCO 210 for tuning.

VCO 210 may be an electronic oscillator configured to control oscillation frequency by a voltage input. Thus, the frequency of oscillation created is varied by the applied voltage. Based on the voltages VCO 210 receives from loop filter 208, VCO 210 tunes, or changes, the frequency and/or phase of its output to better track, once it is divided, the data signal 110 and outputs a signal identified as VCO signal 228. Like data signal 110 and clock signal 222, VCO signal 228 may take any waveform, including a square wave and may be in the form of a differential signal.

Because, in some embodiments, VCO 210 produces VCO signal 228 at a higher frequency than data signal 110, divider 212 is used to divide down the VCO signal 228 and generates divided VCO signal 230. In some embodiments, divider 212 divides VCO signal 228 by 2 to create two distinct loops carrying divided VCO signal 230 that are fed into PFD 206 after, in some embodiments, being buffered by buffers 218 and 220. In alternative embodiments, divider 212 divides VCO signal 228 by 4 to create 2 distinct loops carrying 4 different phases (i.e., 2 different differential pairs) of divided VCO signal 230 in each loop that are fed into PFD 206 after, in some embodiments, being buffered by buffers 219 and 220. Thus, the divided VCO signal 230 may include 4 different signals at the same frequency but with 4 different phases (e.g., 0 degrees, 90 degrees, 180 degrees, and 270 degrees). Divider 212 may be a negative feedback D flip-flop. In other words, the negative output of divider 212 may act as an input for divider 212.

Because PFD 206 is physically separated from VCO 210, capacitance increases in the system. Therefore, in an embodiment, buffers 218 and 220 receive divided VCO signal 230 and may delay the transit of divided VCO signal 230 back to PFD 206. Once buffering is complete, buffers 218 and 220 may generate clock signal 222 to feed back into PFD 206. In other words, divided VCO signal 230 is clock signal 222 prior to buffering. Hence, clock signal 222 may include 4 different signals at the same frequency but with 4 different phases (e.g., 0 degrees, 90 degrees, 180 degrees, and 270 degrees). In alternative embodiments, buffers 218 and 220 do not exist and the divided VCO signal 230 is clock signal 222.

LOL detector 216 is configured to determine whether the frequency of clock signal 222 is locked to the frequency of data signal 110 and/or if a locked clock signal 222 experiences a loss of lock with data signal 110. LOL detector 216 is coupled to PFD 206 and may send a lock signal 226 to PFD 206 that indicates that the clock signal 222 is locked to data signal 110 and/or that the clock signal 222 has lost lock or is not locked to data signal 110.

PFD 206 also provides a retimed, based on the locked clock signal 222, data signal 110 to output driver 214. This retimed data signal 110 provided to output driver 214 may be termed an output retimed data signal 232. Output driver 214 is any type of output driver that may transmit the output retimed data signal 232 to receiver 106 for further processing as output signal 112. In some embodiments, output driver 214 is an optical output driver such as a electroabsorptive modulated laser (EML).

Figure 3:
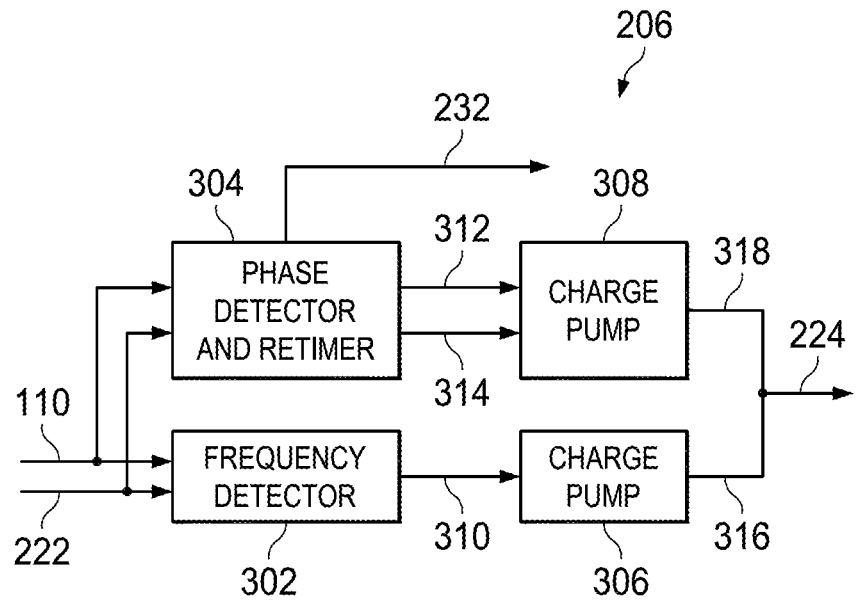
FIG. 3 shows a block diagram of a phase-frequency detector circuit (PFD) in accordance with various embodiments.

FIG. 3 shows a block diagram of PFD 206 in accordance with various embodiments. PFD 206 may include frequency detector 302 connected to charge pump 306 and phase detector and retimer circuit (PDR) 304 connected to charge pump 308. Frequency detector 302 may be configured to acquire the frequency of data signal 110. In some embodiments, frequency detector 302 is a binary phase detector. Frequency detector 302 receives data signal 110 and clock signal 222 and may compare the rising edge of the data signal 110 square wave to the rising edge of the clock signal 222 square wave and generate error signal 310 based on the comparison. Error signal 310 may be designated as an UP or DOWN signal or pulse.

An UP signal created by frequency detector 302 may be an indication that the frequency of data signal 110 is higher than the frequency of clock signal 222. A DOWN error signal created by frequency detector 302 may be an indication that the frequency of input signal 110 is lower than the frequency of clock signal 222. Charge pump 306 may receive error signal 310 from frequency detector 302 and translate the error signal 310 into proportional positive and negative charge packets which is output as a charge pump output signal 316. If charge pump 306 receives an UP error signal, this may indicate that the data signal 110 frequency is higher than the clock signal 222 frequency, and a positive charge may be created to tune VCO 210 to produce a higher frequency VCO signal 228. If charge pump 306 receives a DOWN error signal, this may indicate that the data signal 110 frequency is lower than the clock signal 222 frequency, and a negative charge may be created to tune VCO 210 to produce a lower frequency VCO signal 228.

PDR 304 also receives data signal 110 and clock signal 222 as input. In some embodiments, PDR 304 includes a ternary phase detector. PDR 304 may compare the rising edge of the input signal 110 square wave to the rising edge of the clock signal 222 square wave and generate error signals 312 and 314 based on the comparison. Because PDR 304 may not be able to make a determination as to whether the clock signal 222 is leading or lagging data signal 110, PDR 304 may instead wait to output either of error signals 312 and/or 314 until after the requisite data transition allows for a determination of whether clock signal 222 has a higher or lower frequency than data signal 110. Error signal 312 may be designated as an UP error signal or pulse while error signal 314 may be designated as a DOWN error signal or pulse. An UP error signal created by PDR 304 may be an indication that the frequency of data signal 110 is higher than the frequency of clock signal 222. A DOWN error signal created by PDR 304 may be an indication that the frequency of data signal 110 is lower than the frequency of clock signal 222.

Charge pump 308 receives error signals 312 and/or 314 from PDR 304 and translates the error signals 312 and/or 314 into one bit time wide positive and negative charge packets which is output as a charge pump output signal 318. If charge pump 308 receives an UP error signal, this may indicate that the data signal 110 frequency is higher than the clock signal 222 frequency, and a positive charge may be created to tune VCO 210 to produce a higher frequency VCO signal 228. If charge pump 308 receives a DOWN error signal, this may indicate that the input signal 110 frequency is lower than the clock signal 222 frequency, and a negative charge may be created to tune VCO 210 to produce a lower frequency VCO signal 228. Charge pump output signals 316 and 318 are combined to create combined charge pump output signal 224 to be fed into loop filter 208 and VCO 210. PDR 304 also may retime data signal 110 based on the phase and frequency of clock signal 222. Thus, PDR 304 may sample data signal 110 and regenerate it based on clock signal 222 generating output retimed data signal 232 which is fed into output driver 214.

Figure 4:
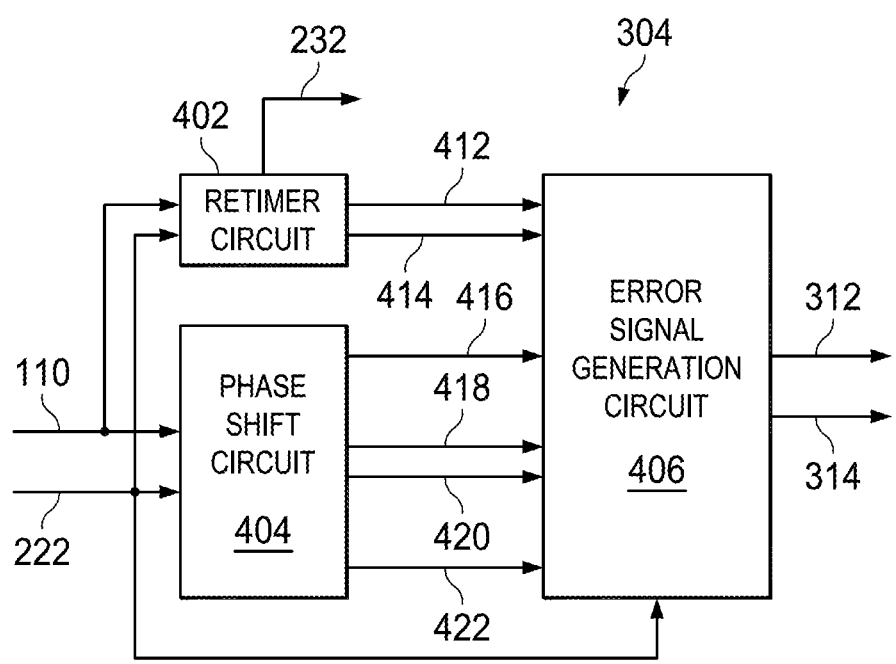
FIG. 4 shows a block diagram of a phase detector and retimer circuit (PDR) in accordance with various embodiments.

FIG. 4 shows a block diagram of PDR 304 in accordance with various embodiments. PDR 304 may include retimer circuit 402, phase shift circuit 404, and error signal generation circuit 406 which may be coupled to both retimer circuit 402 and phase shift circuit 404. Retimer circuit 402 is configured to receive data signal 110 and clock signal 222 and generate the output data signal 232 to be fed into output driver 214. Retimer circuit 402 also may generate retimed data signals 412 and 414 that are fed into error signal generation circuit 406. Retimed data signals 412 and 414 form a differential pair. In other words, retimed data signals 412 and 414 have the same frequency but are 180 degrees out of phase with one another. Retimed data signals 412 and 414 are two versions of the data signal 110 after it has been retimed on the rising and falling clock edge, respectively. One of retimed data signals 412 and 414 become output retimed data signal 232.

Phase shift circuit 404 is configured to receive data signal 110 and clock signal 222 and phase shift the data signal to generate phase shifted data signals 416, 418, 420, and 422. Phase shifted data signals 416-422 are phase shifted versions of data signal 110. In other words, phase shifted data signals 416-422 have the same frequency as data signal 110 and each other, but each of phase shifted data signals 416-422 is at a different phase.

Error signal generation circuit 406 is configured to receive retimed data signals 412-414, phase shifted data signals 416-422, and clock signal 222. Based on the retimed data signals 412-414, phase shifted data signals 416-422, and clock signal 222, error signal generation circuit 406 is configured to generate error signals 312 and 314.

Figure 5:
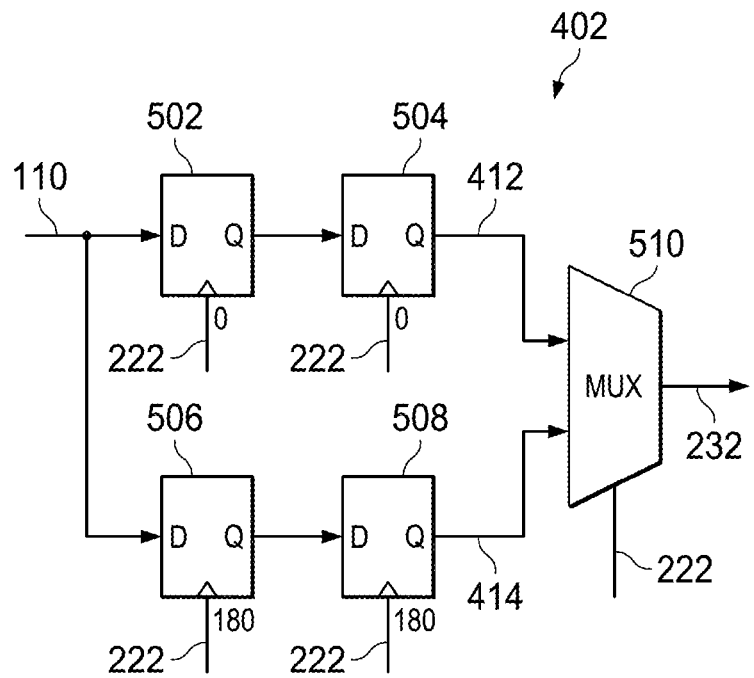
FIG. 5 shows a circuit diagram of a retimer circuit in accordance with various embodiments.

FIG. 5 shows a circuit diagram of retimer circuit 402 in accordance with various embodiments. Retimer circuit 402 may comprise flip-flops 502, 504, 506, and 508 as well as multiplexer 510. In some embodiments, flip-flops 502-508 are D flip-flops and more particularly may be master-slave edge-triggered D flip-flops. Flip-flop 502 is configured to receive data signal 110 as its D-input and clock signal 222 as its clock input. More particularly, in some embodiments, the 0 degree phase of clock signal 222 acts as the clock input for flip-flop 502. The Q output of flip-flop 502 then may act as the D input for flip-flop 504. In some embodiments, the 0 degree phase of clock signal 222 acts as the clock input for flip-flop 504. The Q output of flip-flop 504 is the retimed data signal 412. In this way, data signal 110 is clocked with the locally generated clean clock signal 222 at a 0 degree phase.

Flip-flop 506 is configured to receive data signal 110 as its D-input and clock signal 222 as its clock input. More particularly, in some embodiments, the 180 degree phase of clock signal 222 acts as the clock input for flip-flop 506. The Q output of flip-flop 506 then may act as the D input for flip-flop 508. In some embodiments, the 180 degree phase of clock signal 222 acts as the clock input for flip-flop 508. The Q output of flip-flop 508 is the retimed data signal 414. In this way, data signal 110 is clocked with the locally generated clean clock signal 222 at a 180 degree phase.

Because the clock signal 222 may clock data signal 110 close to the beginning or ending of the flip-flops 502 and 504 timing aperture, the settling time (i.e., output of flip-flops 502 and 504) may take longer than expected. Therefore, the flip-flop 504 in series with flip-flop 502 and flip-flop 508 in series with flip-flop 506 allows for settling of the signals passing through the flip-flops 502-508 such that retimed data signals 412-414 have cleanly retimed rising and falling edges.

Multiplexer 510 is configured to receive retimed data signals 412 and 414 and generate the output retimed data signal 232 that is provided to output driver 214. As a multiplexer, multiplexer 510 selects one of its input signals, retimed data signal 412 or 414, as its output, output retimed data signal 232. The selector of multiplexer 510 is clock signal 222, and more particularly, one phase of clock signal 222. Therefore, the selection of output data signal 232 is based on clock signal 222. In an embodiment, the selector of multiplexer 510 is the 90 degree phase of clock signal 222.

Figure 6:
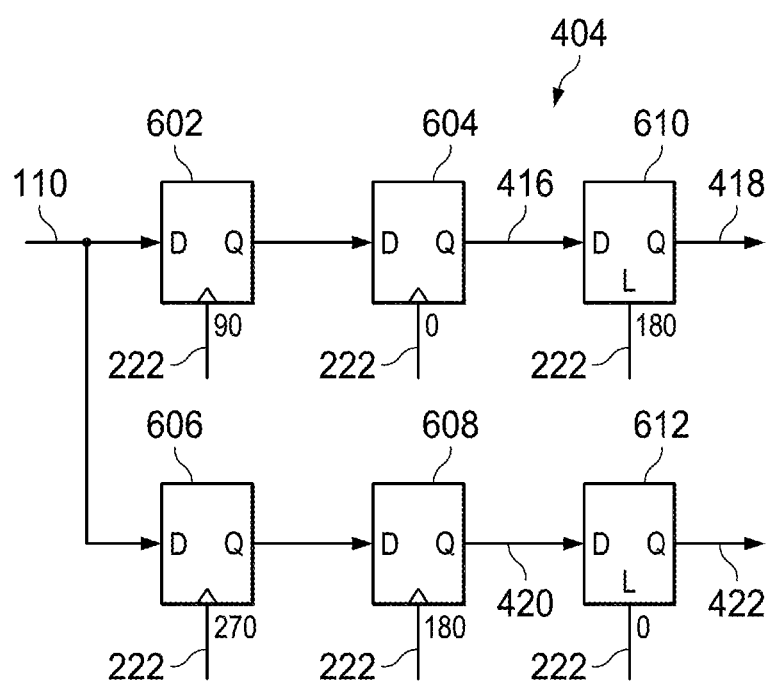
FIG. 6 shows a circuit diagram of a phase shift circuit in accordance with various embodiments.

FIG. 6 shows a circuit diagram of phase shift circuit 404 in accordance with various embodiments. Phase shift circuit 404 may include flip-flops 602, 604, 606, and 608 and latches 610 and 612. In some embodiments, flip-flops 502-508 are D flip-flops and more particularly may be master-slave edge-triggered D flip-flops. In some embodiments latches 610-612 are gated D latches (i.e., half of a D flip-flop).

Flip-flop 602 is configured to receive data signal 110 as its D-input and clock signal 222 as its clock input. More particularly, in some embodiments, the 90 degree phase of clock signal 222 acts as the clock input for flip-flop 602. The Q output of flip-flop 602 then may act as the D input for flip-flop 604. In some embodiments, the 0 degree phase of clock signal 222 acts as the clock input for flip-flop 604. The Q output of flip-flop 604, phase shifted data signal 416, then may act as the D input for latch 610. In some embodiments, the 180 degree phase of clock signal 222 acts as the clock input for latch 610. The Q output of latch 610 is phase shifted data signal 418. Phase shifted data signals 416 and 418 may form a differential pair. In other words, phase shifted data signals 416 and 418 have the same frequency but are 180 degrees out of phase with one another. In this way, phase shift circuit 404 generates two phase shifted data signals 416 and 418 with the same frequency of data signal 110 that have phases that allow them to be combined with retimed data signals 412 and 414 without creating glitches.

Flip-flop 606 is configured to receive data signal 110 as its D-input and clock signal 222 as its clock input. More particularly, in some embodiments, the 270 degree phase of clock signal 222 acts as the clock input for flip-flop 606. The Q output of flip-flop 606 then may act as the D input for flip-flop 608. In some embodiments, the 180 degree phase of clock signal 222 acts as the clock input for flip-flop 608. The Q output of flip-flop 608, phase shifted data signal 420, then may act as the D input for latch 612. In some embodiments, the 0 degree phase of clock signal 222 acts as the clock input for latch 612. The Q output of latch 612 is phase shifted data signal 422. Phase shifted data signals 420 and 422 may form a differential pair. In other words, phase shifted data signals 420 and 422 have the same frequency but are 180 degrees out of phase with one another. Additionally, phase shifted data signals 420 and 422 may be 90 degrees out of phase with phase shifted data signals 416 and 418. In this way, phase shift circuit 404 generates two phase shifted data signals 420 and 422 with the same frequency of data signal 110 that have phases that allow them to be combined with retimed data signals 412 and 414 without creating glitches. While the above discussion utilizes latches 610 and 612, flip-flops may also be used instead. However, the use of latches 610 and 612, instead of flip-flops, reduces circuitry, thus leading to a faster circuit that requires less power.

Figure 7:
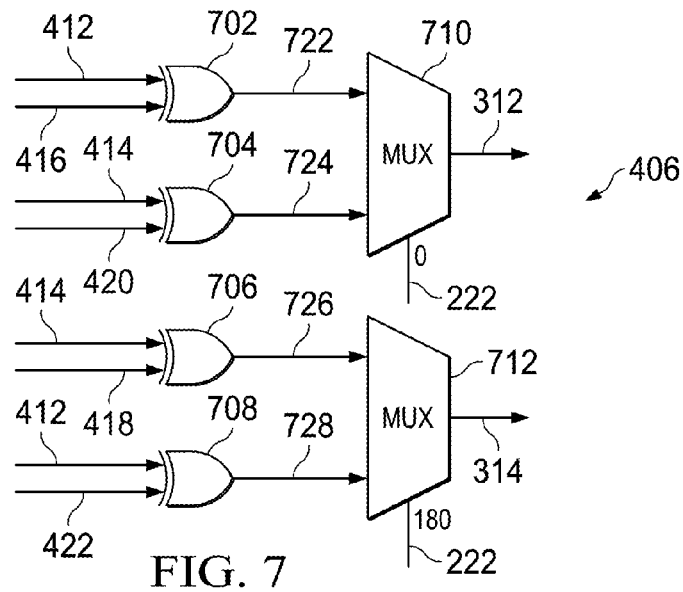
FIG. 7 shows a circuit diagram of an error signal generation circuit in accordance with various embodiments.

FIG. 7 shows a circuit diagram of error signal generation circuit 406 in accordance with various embodiments. Error generation circuit 406 may include exclusive OR (XOR) logic gates 702, 704, 706, and 708 and multiplexers 712 and 710. XOR gate 702 is configured to receive retimed data signal 412 and phase shifted data signal 416, perform a XOR function on retimed data signal 412 and phase shifted data signal 416 (i.e., outputs a HIGH signal only when one input is HIGH and one input is LOW, a LOW signal when both inputs are HIGH or when both inputs are LOW), and generate UP signal 722 based on the result of the XOR function. Similarly, XOR gate 704 is configured to receive retimed data signal 414 and phase shifted data signal 420, perform a XOR function on retimed data signal 414 and phase shifted data signal 420, and generate UP signal 724 based on the result of the XOR function.

Multiplexer 710 is configured to receive UP signals 722 and 724 and generate error signal 312 (i.e., UP error signal 312) that is provided to charge pump 308. As a multiplexer, multiplexer 710 selects one of its input signals, UP signals 722-724, as its output, error signal 312. The selector of multiplexer 710 is clock signal 222, and more particularly, in an embodiment, the 0 degree phase of clock signal 222. Therefore, the selection of error signal 312 is based on clock signal 222.

XOR gate 706 is configured to receive retimed data signal 414 and phase shifted data signal 418, perform a XOR function on retimed data signal 414 and phase shifted data signal 418, and generate DOWN signal 726 based on the result of the XOR function. Similarly, XOR gate 708 is configured to receive retimed data signal 412 and phase shifted data signal 422, perform a XOR function on retimed data signal 412 and phase shifted data signal 422, and generate DOWN signal 728 based on the result of the XOR function.

Multiplexer 712 is configured to receive DOWN signals 726 and 728 and generate error signal 314 (i.e., DOWN error signal 314) that is provided to charge pump 308. As a multiplexer, multiplexer 712 selects one of its input signals, DOWN signals 726-728, as its output, error signal 314. The selector of multiplexer 712 is clock signal 222, and more particularly, in an embodiment, the 180 degree phase of clock signal 222. Therefore, the selection of error signal 314 is based on clock signal 222.

Each of flip-flops 502 and 506 from FIG. 5 and flip-flops 602 and 606 from FIG. 6 receive data signal 110 as their D inputs and clock signal 222 as their clock inputs. However, in some embodiments, the clock signal 222 acting as the clock inputs for each of flip-flops 502, 506, 602, and 606 is at a different phase (i.e., 0 degrees, 90 degrees, 180 degrees, and 270 degrees). Therefore, retimed data signals 412-414 and phase shifted data signals 416-422 may result from different phases of clock signal 222. This results in error signal generation circuit 406 generating error signals 312 and 314 based on both the rising and falling edges of clock signal 222 which may result in better positioning of clock signal 222.

Figure 8:
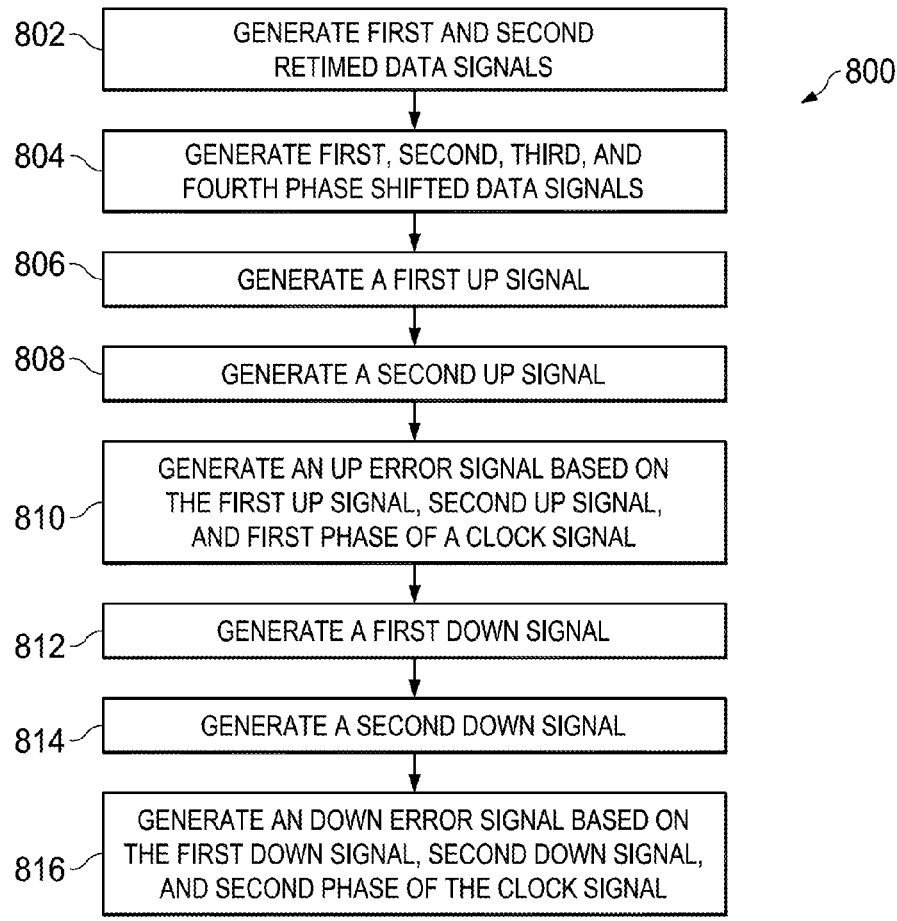
FIG. 8 shows a flow diagram of a method for generating error signals in a clock and data recovery circuit in accordance with various embodiments.

FIG. 8 shows a flow diagram of a method 800 for generating error signals 312-314 in CDR 104 in accordance with various embodiments. Though depicted sequentially as a matter of convenience, at least some of the actions shown in method 800 can be performed in a different order and/or performed in parallel. Additionally, some embodiments may perform only some of the actions shown or may perform additional actions. In some embodiments, at least some of the operations of the method 800, as well as other operations described herein, can be performed by CDR 104 implemented by a processor executing instructions stored in a non-transitory computer readable storage medium or a state machine.

The method 800 begins in block 802 with generating, by, in some embodiments, retimer circuit 402 utilizing flip-flops 502-508, a first and second retimed data signal (e.g., retimed data signals 412 and 414). In block 804, the method 800 continues with generating first, second, third, and fourth phase shifted data signals (e.g., phase shifted data signals 416-422). These phase shifted data signals may be generated utilizing phase shift circuit 404. More particularly, flip-flops 602-608 and latches 610-622 may be utilized to generate the first, second, third, and fourth phase shifted data signals.

The method 800 continues in block 806 with generating a first UP signal (e.g., UP signal 722). The first UP signal may be generated by performing a XOR function on the retimed data signal 412 and phase shifted data signal 416 utilizing XOR logic gate 702. In block 808, the method 800 continues with generating a second UP signal (e.g., UP signal 724). The second UP signal may be generated by performing a XOR function on the retimed data signal 414 and phase shifted data signal 420 utilizing XOR logic gate 704. The method 800 continues in block 810 with generating an UP error signal (e.g., UP error signal 312) based on the first UP signal (e.g., UP signal 722), second UP signal (e.g., UP signal 724), and a first phase of a clock signal (e.g., the 0 degree phase of clock signal 222). The generating an UP error signal may be accomplished utilizing multiplexer 710.

The method 800 continues in block 812 with generating a first DOWN signal (e.g., DOWN signal 726). The first DOWN signal may be generated by performing a XOR function on the retimed data signal 414 and phase shifted data signal 418 utilizing XOR logic gate 706. In block 814, the method 800 continues with generating a second DOWN signal (e.g., DOWN signal 728). The second DOWN signal may be generated by performing a XOR function on the retimed data signal 412 and phase shifted data signal 422 utilizing XOR logic gate 708. The method 800 continues in block 816 with generating a DOWN error signal (e.g., DOWN error signal 314) based on the first DOWN signal (e.g., DOWN signal 726), second DOWN signal (e.g., DOWN signal 728), and a second phase of a clock signal (e.g., the 180 degree phase of clock signal 222). The generating a DOWN error signal may be accomplished utilizing multiplexer 712.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A phase detector and retimer circuit, comprising:
a retimer circuit configured to receive a data signal and generate a first retimed data signal based on a first phase of a clock signal and a second retimed data signal based on a second phase of the clock signal;
a phase shift circuit coupled to the retimer circuit, the phase shift circuit configured to receive the data signal and phase shift the data signal to generate a first phase shifted data signal, a second phase shifted data signal, a third phase shifted data signal, and a fourth phase shifted data signal; and
an error signal generation circuit coupled to the retimer circuit and the phase shift circuit, the error signal generation circuit configured to generate a first error signal and a second error signal based on the first and second retimed data signals and the first, second, third, and fourth phase shifted data signals.

2. The phase detector and retimer circuit of claim 1, wherein the retimer circuit comprises a first flip-flop, a second flip-flop, a third flip-flop, and a fourth flip-flop, the first and second flip-flops configured to receive the data signal, the third flip-flop configured to generate the first retimed data signal and the fourth flip-flop configured to generate the second retimed data signal.

3. The phase detector and retimer circuit of claim 2, wherein an output of the first flip-flop is received by the third flip-flop and an output of the second flip-flop is received by the fourth flip-flop.

4. The phase detector and retimer circuit of claim 3, wherein the first and third flip-flops are configured to receive the first phase of the clock signal and the second and fourth flip-flops are configured to receive the second phase of the clock signal.

5. The phase detector and retimer circuit of claim 1, wherein the retimer circuit comprises a multiplexer configured to receive the first retimed data signal and the second retimed data signal and generate an output retimed data signal.

6. The phase detector and retimer circuit of claim 5, wherein the phase shift circuit comprises a first flip-flop, a second flip-flop, a third flip-flop, a fourth flip-flop, a first latch, and a second latch, the first and second flip-flops configured to receive the data signal, the third flip-flop configured to generate the first phase shifted data signal, the fourth flip-flop configured to generate the second phase shifted data signal, the first latch configured to generate the third phase shifted data signal, and the second latch configured to generate the fourth phase shifted data signal.

7. The phase detector and retimer circuit of claim 6, wherein the third flip-flop is configured to receive an output of the first flip-flop, the fourth flip-flop is configured to receive an output of the second flip-flop, the first latch is configured to receive the first phase shifted data signal, and the second latch is configured to receive the second phase shifted data signal.

8. The phase detector and retimer circuit of claim 5, wherein the third flip-flop and second latch are configured to receive the first phase of the clock signal, the fourth flip-flop and first latch are configured to receive the second phase of the clock signal, the first flip-flop is configured to receive a third phase of the clock signal, and the second flip-flop is configured to receive a fourth phase of the clock signal.

9. The phase detector and retimer circuit of claim 1, wherein the error signal generation circuit comprises a first exclusive OR (XOR) logic gate configured to receive the first retimed data signal and the first phase shifted data signal and generate a first UP signal.

10. The phase detector and retimer circuit of claim 9, wherein the error signal generation circuit further comprises:
a second XOR logic gate configured to receive the second retimed data signal and the second phase shifted data signal and generate a second UP signal; and
a first multiplexer configured to receive the first and second UP signals and generate the first error signal based on the first phase of the clock signal.

11. The phase detector and retimer circuit of claim 10, wherein the error signal generation circuit further comprises:
a third XOR logic gate configured to receive the second retimed data signal and the third phase shifted data signal and generate a first DOWN signal;
a fourth XOR logic gate configured to receive the first retimed data signal and the fourth phase shifted data signal and generate a second DOWN signal; and
a second multiplexer configured to receive the first and second DOWN signals and generate the second error signal based on the second phase of the clock signal.

12. A clock and data recovery (CDR) circuit, comprising:
a phase-frequency detector (PFD) circuit configured to lock a clock signal to a data signal, the PFD circuit including a frequency detector and a phase detector and retimer circuit, the phase detector and retimer circuit configured to generate an UP error signal and a DOWN error signal based on a first and a second retimed data signal and a first, a second, a third, and a fourth phase shifted data signal; and
a voltage-controlled oscillator (VCO) coupled to the PFD, the VCO configured to generate a VCO output signal that, after being divided, becomes the clock signal.

13. The CDR circuit of claim 12, wherein first retimed data signal is generated by a first and a second flip-flop in series, the first flip-flop configured to receive the data signal and a first phase of the clock signal.

14. The CDR circuit of claim 13, wherein the first phase shifted data signal is generated by a third and a fourth flip-flop in series, the third flip-flop configured to receive the data signal and a second phase of the clock signal and the fourth flip-flop configured to receive an output of the third flip-flop and the first phase of the clock signal.

15. The CDR circuit of claim 14, wherein the second phase shifted data signal is generated by a first latch in series with the third and the fourth flip-flops, the first latch configured to receive an output signal from the fourth flip-flop and a third phase of the clock signal.

16. The CDR circuit of claim 15, wherein the first phase of the clock signal is 0 degrees, the second phase of the clock signal is 90 degrees, and the third phase of the clock signal is 180 degrees.

17. The CDR circuit of claim 12, wherein the UP error signal is generated by a first and a second logic gate in series with a first multiplexer, wherein:
the first logic gate is configured to receive the first retimed data signal and the first phase shifted data signal and generate a first UP signal;
the second logic gate is configured to receive the second retimed data signal and the second phase shifted data signal and generate a second UP signal; and the first multiplexer is configured to receive the first and the second UP signals and generate the UP error signal.

18. The CDR circuit of claim 17, wherein the DOWN error signal is generated by a third and a fourth logic gate in series with a second multiplexer, wherein:
   the third logic gate is configured to receive the second retimed data signal and the third phase shifted data signal and generate a first DOWN signal;
   the fourth logic gate is configured to receive the first retimed data signal and the fourth phase shifted data signal and generate a second DOWN signal; and
   the second multiplexer is configured to receive the first and the second DOWN signals and generate the DOWN error signal.

19. A method for generating error signals in a clock and data recovery circuit (CDR) comprising:
   generating a first and a second retimed data signal;
   generating a first, a second, a third, and a fourth phase shifted data signal;
   generating a first UP signal by performing an exclusive OR (XOR) function on the first retimed data signal and the first phase shifted data signal;
   generating a second UP signal by performing a XOR function on the second retimed data signal and the second phase shifted data signal; and
   generating an UP error signal based on the first UP signal, the second UP signal, and a first phase of a clock signal.

20. The method of claim 19, further comprising:
   generating a first DOWN signal by performing a XOR function on the second retimed data signal and the third phase shifted data signal;
   generating a second DOWN signal by performing a XOR function on the first retimed data signal and the fourth phase shifted data signal; and
   generating a DOWN error signal based on the first DOWN signal, the second DOWN signal, and a second phase of the clock signal.

* * * * *